US012805323B2

(12) United States Patent
Wu et al.

(10) Patent No.: US 12,805,323 B2
(45) Date of Patent: Nov. 17, 2026

(54) POWER ELECTRONIC DEVICES AND METHODS OF PACKAGING POWER ELECTRONIC DEVICES TAILORED FOR TRANSIENT THERMAL MANAGEMENT

(71) Applicant: RAYTHEON TECHNOLOGIES CORPORATION, Farmington, CT (US)

(72) Inventors: Hailing Wu, Glastonbury, CT (US); Xin Wu, Glastonbury, CT (US); Yongduk Lee, Vernon, CT (US)

(73) Assignee: RTX CORPORATION, Farmington, CT (US)

( * ) Notice: Subject to any disclaimer, the term of this patent is extended or adjusted under 35 U.S.C. 154(b) by 1174 days.

(21) Appl. No.: 17/738,962

(22) Filed: May 6, 2022

(65) Prior Publication Data

US 2023/0360998 A1 Nov. 9, 2023

(51) Int. Cl.

| | |
|---|---|
| ***H01L 21/48*** | (2006.01) |
| ***H01L 21/56*** | (2006.01) |
| ***H01L 23/00*** | (2006.01) |
| ***H01L 23/31*** | (2006.01) |
| ***H01L 23/427*** | (2006.01) |
| ***H01L 23/433*** | (2006.01) |

(52) U.S. Cl.

CPC ........ *H01L 23/427* (2013.01); *H01L 21/4882* (2013.01); *H01L 21/56* (2013.01); *H01L 23/3107* (2013.01); *H01L 23/4334* (2013.01); *H01L 24/48* (2013.01); *H01L 2224/48225* (2013.01)

(58) Field of Classification Search

CPC ... H01L 23/427; H01L 21/4882; H01L 21/56; H01L 23/3107; H01L 23/4334; H01L 24/48; H01L 2224/48225; H01L 23/3121; H01L 23/295; H01L 23/373; H01L 23/552; H01L 23/3737

See application file for complete search history.

(56) References Cited

U.S. PATENT DOCUMENTS

| | | | | |
|---|---|---|---|---|
| 6,703,128 | B2 | 3/2004 | Myers et al. | |
| 7,106,588 | B2 * | 9/2006 | Oberlin | H01L 23/4275 361/717 |
| 8,016,022 | B2 | 9/2011 | Richason et al. | |
| 9,036,352 | B2 | 5/2015 | Engelhardt et al. | |
| 10,485,138 | B2 | 11/2019 | Engelhardt et al. | |
| 2008/0272331 | A1 * | 11/2008 | Mohapatra | C09K 5/10 977/840 |

(Continued)

FOREIGN PATENT DOCUMENTS

| | | |
|---|---|---|
| JP | 0697335 | 4/1994 |

OTHER PUBLICATIONS

European Patent Office, European Search Report dated Sep. 8, 2023 in Application No. 23159793.1.

*Primary Examiner* — Jonathan Han
(74) *Attorney, Agent, or Firm* — SNELL & WILMER L.L.P.

(57) ABSTRACT

A power electronic package may comprise a substrate, a semiconductor die bonded to a first surface of the substrate, and an encapsulant deposited over the semiconductor die and substrate. A plurality of encapsulated heat sinks may be dispersed in the encapsulant and/or a plurality of heating pipes may be located in the encapsulant and over an active surface of the semiconductor die.

20 Claims, 5 Drawing Sheets

(56) References Cited

U.S. PATENT DOCUMENTS

| | | | |
|---|---|---|---|
| 2010/0155934 | A1 | 6/2010 | Yim et al. |
| 2014/0054077 | A1 | 2/2014 | Minamio et al. |
| 2019/0096780 | A1 | 3/2019 | Roesner et al. |

* cited by examiner

POWER ELECTRONIC DEVICES AND METHODS OF PACKAGING POWER ELECTRONIC DEVICES TAILORED FOR TRANSIENT THERMAL MANAGEMENT

GOVERNMENT LICENSE RIGHTS

This invention was made with Government support under Contract NNC15BA06B awarded by the United States NASA. The Government has certain rights in this invention.

FIELD

The present disclosure relates to power electronic devices, and, more particularly to power electronic devices and methods of packaging power electronic devices.

BACKGROUND

Power electronics is the application of electronic devices to the control and conversion of electric power. Power electronics convert electrical energy of one type into a different type. For example, power electronics may be employed to drive a device associated with an input of electric power that is different than the power supplied/output by the power source. Power electronics generally employ semiconductor switching devices such as diodes, thyristors, power transistors (e.g., power metal-oxide-semiconductor field-effect transistors (MOSFETs), insulated-gate bipolar transistors (IGBTs), etc.), or the like to convert electrical energy of one type into another type.

Thermal management of power electronics has generally been focused on developing cooling solutions for steady-state operation. However, transient processes, which involve time-varying loads, also occur. Thermal management tailored for transient processes is desirable, as better thermal management can increase performance and reliability, as well as decrease weight and overall device footprint.

SUMMARY

A power electronic package is disclosed herein. In accordance with various embodiments, the power electronic package may comprise a substrate, a semiconductor die bonded to a first surface of the substrate, an encapsulant deposited over the semiconductor die and the substrate, and a plurality of encapsulated heat sinks dispersed in the encapsulant.

In various embodiments, a heat sink may be bonded to a surface of the substrate opposite the semiconductor die. In various embodiments, each encapsulated heat sink of the plurality of encapsulated heat sinks includes a heat sink material and an encapsulation layer surrounding the heat sink material.

In various embodiments, the heat sink material may have a melting point between 80° C. and 120° C. In various embodiments, each encapsulated heat sink of the plurality of encapsulated heat sinks may further include a plurality of thermally conductive heat spreading elements located within the encapsulation layer.

In various embodiments, the thermally conductive heat spreading elements may include nano-sized particles. In various embodiments, the thermally conductive heat spreading elements may include at least one of nano-sized graphene particles, carbon nanotubes, or boron nitride nanosheets.

In various embodiments, a plurality of heat pipes may be located in the encapsulant.

A power electronic package, in accordance with various embodiments, may comprise a substrate, a semiconductor die bonded to a first surface of the substrate, an encapsulant deposited over the semiconductor die and the substrate, and a plurality of heat pipes located in the encapsulant.

In various embodiments, each heat pipe of the plurality of heat pipes includes a working fluid having a boiling point between 80° C. and 120° C. In various embodiments, at least one heat pipe of the plurality of heat pipes is located over an active surface of the semiconductor die. In various embodiments, the at least one heat pipe is configured to direct heat away from the active surface of the semiconductor die.

In various embodiments, a heat sink may be located over a surface of the substrate opposite the semiconductor die. In various embodiments, the plurality of heat pipes is configured to direct heat away toward a surface of the encapsulant. The surface of the encapsulant is distal to the heat sink.

In various embodiments, a plurality of encapsulated heat sinks may be dispersed in the encapsulant. In various embodiments, each encapsulated heat sink of the plurality of encapsulated heat sinks includes a heat sink material and an encapsulation layer surrounding the heat sink material. In various embodiments, the heat sink material may have a melting point between 80° C. and 120° C.

A method of manufacturing a power electronics package is also disclosed herein. In accordance with various embodiments, the method may comprise the steps of bonding a semiconductor die to a substrate, forming an encapsulant including a plurality of encapsulated heat sinks dispersed in the encapsulant, and depositing the encapsulant including the plurality of encapsulated heat sinks over the semiconductor die and the substrate.

In various embodiments, the method may further comprise locating a plurality of heat pipes over an active surface of the semiconductor die. In various embodiments, the method may further comprise depositing the encapsulant including the plurality of encapsulated heat sinks over the semiconductor die and the substrate after locating the plurality of heat pipes over the active surface of the semiconductor die.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the exemplary embodiments of the disclosure, it should be understood that other embodiments may be realized and that logical changes and adaptations in design and construction may be made in accordance with this disclosure and the teachings herein. Thus, the detailed description herein is presented for purposes of illustration only and not limitation. The steps recited in any of the method or process descriptions may be executed in any order and are not necessarily limited to the order presented. Furthermore, any reference to singular includes plural embodiments, and any reference to more than one component or step may include a singular embodiment or step.

Disclosed herein is a power electronic (PE) package and method of packaging a PE device. In various embodiments, encapsulated heat sinks may be dispersed in an encapsulant, deposited around the semiconductor die(s) of the PE package. Under elevated power load, an increased temperature of the PE package semiconductor die(s) may cause the heat sink material of the encapsulated heat sinks to melt, thereby absorbing heat from the semiconductor die(s). In various embodiments, thermally conductive heat spreading elements (e.g., graphene, carbon nanotubes, boron nitride nanosheets, etc.) may be included in the package encapsulant and/or may be incorporated into the encapsulant, as well as into the encapsulated heat sinks. The encapsulated heat sinks, in combination with the thermally conductive heat spreading elements and/or particles in the encapsulant, tend to dissipate heat away from the semiconductor die(s). In various embodiments, the thermally conductive heat spreading elements may include one or more heat pipes located in the encapsulant and configured to dissipate heat away from the semiconductor die(s).

Figure 1:
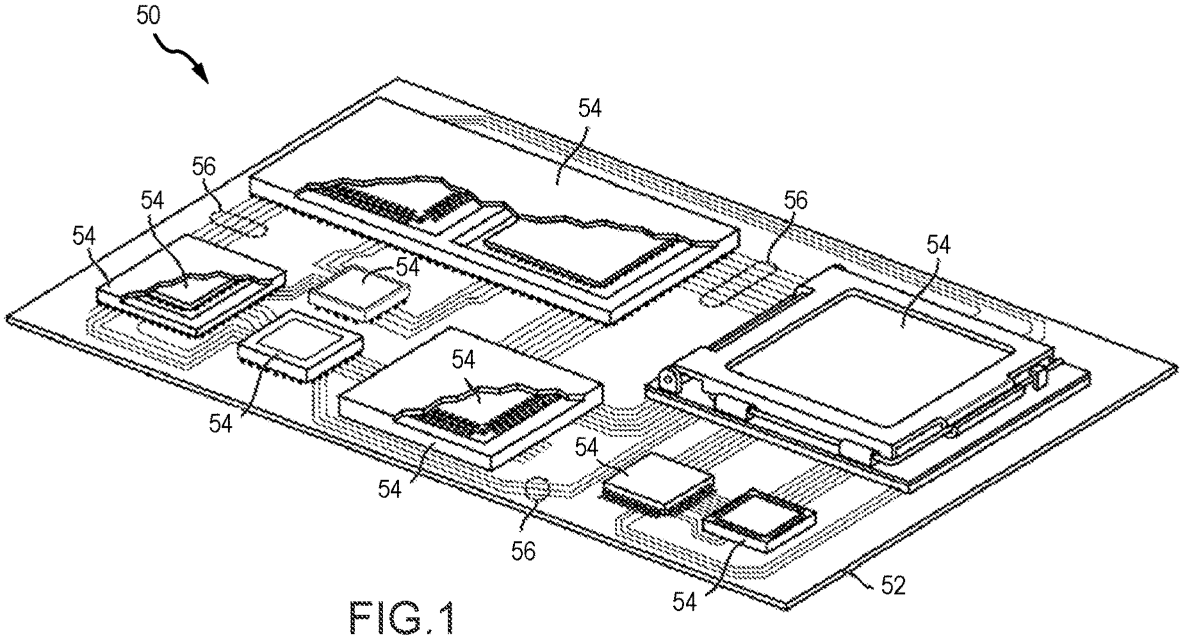
FIG. 1 illustrates a printed circuit board assembly, in accordance with various embodiments.

FIG. 1 illustrates a printed circuit board assembly (PCBA) 50. Printed circuit board assembly 50 includes a substrate or printed circuit board (PCB) 52 and a plurality of semiconductor packages 54 mounted to PCB 52. PCBA 50 may include one type or multiple types of semiconductor packages 54, depending on the application. The different types of semiconductor packages 54 shown in FIG. 1 are for purposes of illustration only.

PCBA 50 can be a stand-alone system that uses the semiconductor packages 54 to perform one or more electrical functions. In various embodiments, PCBA 50 may be a subcomponent of a larger system. For example, PCBA 50 may be part of an aircraft electronics system. Semiconductor packages 54 may include microprocessors, memories, application specific integrated circuits (ASIC), microelectromechanical systems (MEMS), logic circuits, analog circuits, radio frequency (RF) circuits, discrete devices, or other semiconductor die or electrical components. PCB 52 provides a substrate for structural support and electrical interconnect of the semiconductor packages 54 mounted on the PCB 52. Conductive signal traces 56 are formed over a surface and/or within layers of PCB 52. Signal traces 56 may be formed using evaporation, electrolytic plating, electroless plating, screen printing, or other suitable metal deposition process. Signal traces 56 provide electrical communication between semiconductor packages 54, mounted components, and other external system components. Signal traces 56 may also provide power and ground connections to each of the semiconductor packages 54. In various embodiments, one or more of the semiconductor packages 54 is a power electronic (PE) package as disclosed in further detail below.

Figure 2A:
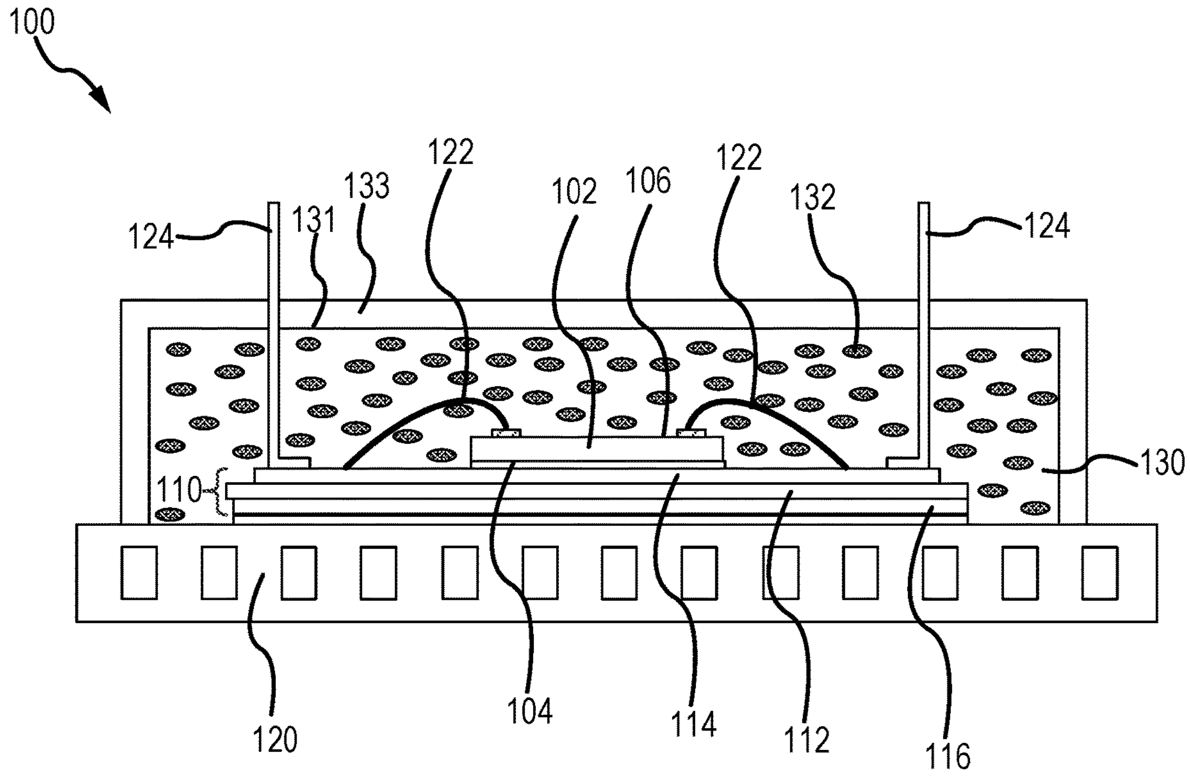
FIG. 2A illustrates an exemplary power electronic package including encapsulated heat sinks, in accordance with various embodiments.

With reference to FIG. 2A, a PE package 100 is illustrated, in accordance with various embodiments. In various embodiments, PE package 100 may be mounted to PCB 52 in FIG. 1. PE package 100 includes a semiconductor die 102. Semiconductor die 102 has a back surface 104 and an active surface 106 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed on active surface 106 to implement analog circuits or digital circuits, such as DSP, ASIC, MEMS, memory, or other signal processing circuit. In one embodiment, active surface 106 contains a MOSFET and/or IGBT. Semiconductor die 102 may also contain integrated passive devices (IPDs), such as inductors, capacitors, and resistors, for RF signal processing.

Semiconductor die 102 is mounted on a substrate 110. For example, back surface may be attached to substrate 110 via solder, an adhesive, or any other suitable bonding material. In various embodiments, substrate 110 may be a direct bonded copper (DCB) substrate. In this regard, substrate 110 may include a ceramic layer 112, a first conductive layer 114 formed over or bonded to a first side of the ceramic layer 112, and a second conductive layer 116 formed over or bonded to a second side of the ceramic layer 112. First and second conductive layers 114, 116 may include one or more layers of aluminum (Al), copper (Cu), tin (Sn), nickel (Ni), gold (Au), silver (Ag), or other suitable electrically conductive material or combination thereof. In various embodiments, first conductive layer 114 may be bonded to ceramic layer 112 using a high-temperature oxidation process. First conductive layer 114 may be chemically etched or otherwise formed into one or more electrical circuit(s) over ceramic layer 112. In various embodiments, the second conductive layer 116 extends continuously and/or uninterrupted over the second side of ceramic layer 112. Ceramic layer 112 may comprise, for example, alumina ($Al_2O_3$), aluminum nitride (AlN), beryllium oxide (BeO) or the like.

In various embodiments, substrate 110 play be attached to a heat sink 120. In this regard, second conductive layer 116 may be bonded to heat sink 120 via solder, an adhesive, or any other suitable bonding material. Heat sink 120 may comprise a metal (e.g., Al, Cu, Ni, Ag), metal alloy, or any other thermally conductive material.

Semiconductor die 102 is electrically connected to first conductive layer 114 via wires 122. Electrically conductive terminal lead 124 is electrically connected to first conductive layer 114. In this regard, semiconductor die 102 is electrically connected to terminal lead 124 via first conductive layer 114 of substrate 110.

In accordance with various embodiments, an encapsulant, or molding compound, 130 is deposited over semiconductor die 102, substrate 110, and heat sink 120 as an insulating material using a paste printing, compressive molding, transfer molding, liquid encapsulant molding, vacuum lamination, spin coating, or other suitable application process. In particular, encapsulant 130 is disposed over and around semiconductor die 102 and substrate 110. Encapsulant 130 may extend to and/or contact heat sink 120. Encapsulant 130 may include polymer composite material, such as silicone gel, epoxy resin with filler, epoxy acrylate with filler, or polymer with proper filler. Encapsulant 130 is electrically non-conductive and environmentally protects the semiconductor device from external elements and contaminants.

Figure 2B:
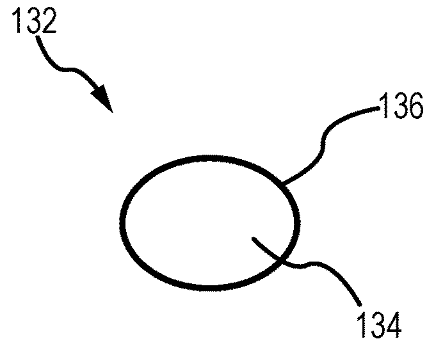
FIG. 2B illustrates encapsulated heat sink, in accordance with various embodiments.

In accordance with various embodiments, an encapsulated heat sinks 132 may be impregnated into, or otherwise dispersed in, encapsulant 130. With additional reference to FIG. 2B, each encapsulated heat sink 132 comprises a heat sink material 134 (also known as thermal storage material and phase change material) and an encapsulation layer 136 surrounding the heat sink material 134.

In various embodiments, encapsulation layer 136 may include a silicon-containing encapsulation material. Encapsulated heat sinks 132 may have an average diameter of less than or equal to about 10 microns. As used in the previous context only, the term "about" means±5 microns. The heat sink material 134 comprises a high heat of fusion material. For example, an energy adsorption associated with the heat sink material 134 changing from a solid to liquid may about 10° C. or greater than a nominal allowable die temperature. For example, heat sink material 134 may have a melting point between 70° C. and 120° C., between 80° C. and 110°, and/or between 90° C. and 100° C. Heat sink material 134 may include, for example, n-alkanes, paraffins, hydrated salts, and/or other organic materials (such as fatty acids). It is to be understood that other heat sink materials may be used if the material has the requisite thermal storage capacity. The heat sink material 134 exchanges heat by undergoing one or more crystal-crystal or crystal-liquid phase transitions during peak energy loads. The heat sink material 134 should have reversible phase transitions with sufficiently large latent heats at the temperatures associated with peak energy loads (e.g., temperatures between 90° C. and 120° C.). The encapsulated heat sink material 134 absorbs excess heat by melting during transient processes with high thermal loads, and then solidifies in response to the thermal load decreasing.

In various embodiments, a greater number and/or greater density of encapsulated heat sinks 132 may be located in encapsulant 130 proximate semiconductor die 102. In this regard, the density and/or number of encapsulated heat sinks 132 may decrease between active surface 106 and the surface 131 of encapsulant 130 (i.e., a greater density and/or number of encapsulated heat sinks 132 is/are located proximate active surface 106 as compared to the density and/or number of encapsulated heat sinks 132 located proximate surface 131). Stated differently, the density of encapsulated heat sinks 132 may be inversely related to the distance from semiconductor die 102. In various embodiments, a shield 133 may be disposed over surface 131 of encapsulant 130. Shield 133 may protect/shield semiconductor die 102 from interference. The density and/or number of encapsulated heat sinks 132 proximate shield 133 may be less than the density and/or number of encapsulated heat sinks 132 proximate semiconductor die 102.

Encapsulant 130 including encapsulated heat sinks 132 tends to provide significant overheat protection according to various embodiments. The encapsulated heat sinks 132 may allow for the size and/or weight of heat sink 120 to be reduced.

Figure 3A:
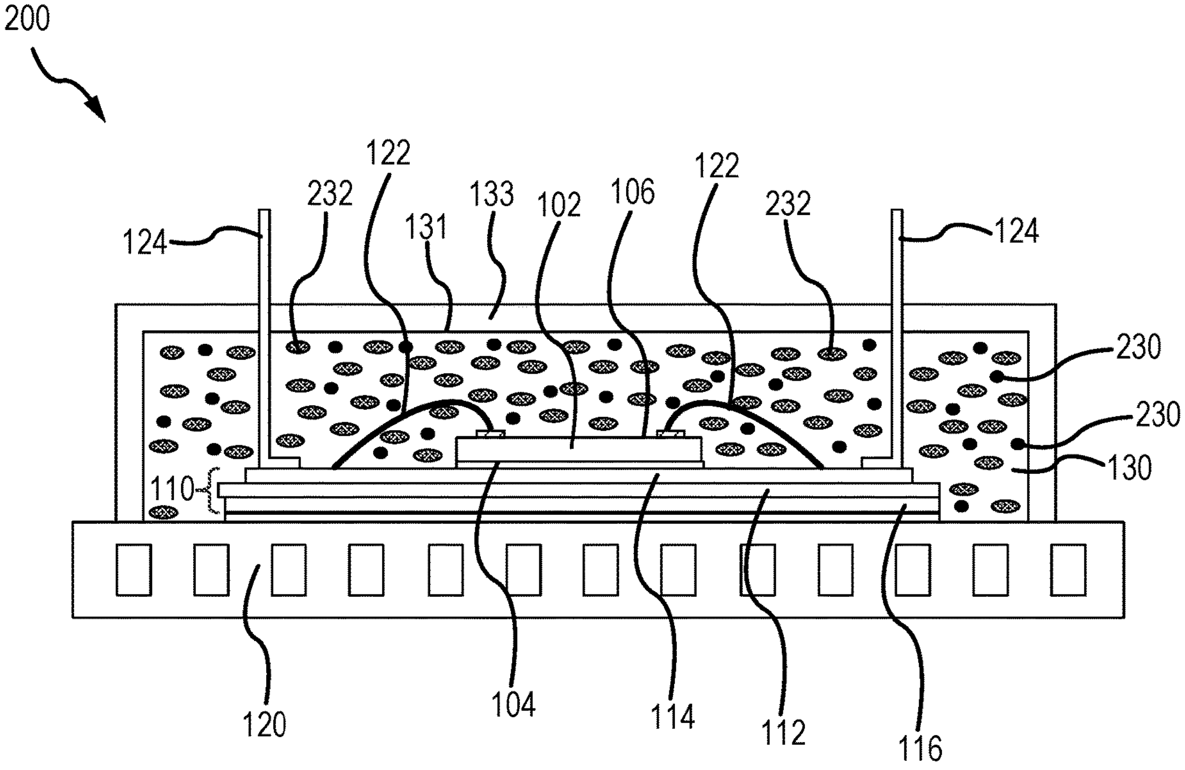
FIG. 3A illustrates an exemplary power electronic package including encapsulated heat sinks and thermally conductive heat spreading elements, in accordance with various embodiments.

With reference to FIG. 3A, a PE package 200 is illustrated, in accordance with various embodiments. In various embodiments, PE package 200 may be mounted to PCB 52 in FIG. 1. PE package 200 may be similar to PE package 100 in FIG. 2A. Accordingly, elements with like numbering are intended to be the same and will not be described again for the sake of brevity.

In accordance with various embodiments, thermally conductive heat spreading elements 230 may be impregnated into, or otherwise dispersed in, encapsulant 130. Thermally conductive heat spreading elements 230 may be nano-sized particles. For example, thermally conductive heat spreading elements 230 may include nano-sized graphene particles, carbon nanotubes, boron nitride nanosheets, etc.

Figure 3B:
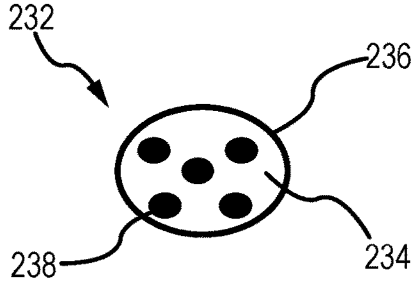
FIG. 3B illustrates encapsulated heat sink having thermally conductive heat spreading elements, in accordance with various embodiments.

In various embodiments, encapsulated heat sinks 232 may also be impregnated into, or otherwise dispersed in, encapsulant 130. With additional reference to FIG. 3B, each encapsulated heat sink 232 comprises a heat sink material 234, an encapsulation layer 236, and thermally conductive heat spreading elements 238. Heat sink material 234 may be similar to heat sink material 134 in FIGS. 2A and 2B. Encapsulation layer 236 may be similar to encapsulation layer 136 in FIGS. 2A and 2B. Thermally conductive heat spreading elements 238 may be nano-sized particles. For example, thermally conductive heat spreading elements 238 may include nano-sized graphene particles, carbon nanotubes, boron nitride nanosheets, etc. Encapsulation layer 236 surrounds heat sink material 234 and thermally conductive heat spreading elements 238. Encapsulated heat sinks 232 may have an average diameter of less than or equal to about 10 microns. As used in the previous context only, the term "about" means±5 microns. In various embodiments, encapsulated heat sinks without thermally conductive heat spreading elements 238 (i.e., encapsulate heat sinks similar to encapsulated heat sinks 132 in FIG. 2A) may be impregnated into, or otherwise dispersed in, encapsulant 130 with thermally conductive heat spreading elements 230.

In various embodiments, a greater number and/or greater density of encapsulated heat sinks 232 and/or a greater number and/or greater density of thermally conductive heat spreading elements 238 may be located in encapsulant 130 proximate semiconductor die 102. In this regard, the density and/or number of encapsulated heat sinks 232 and/or the density and/or number of thermally conductive heat spreading elements 238 may decrease between active surface 106 and the surface 131 of encapsulant 130 (i.e., a greater density and/or number of encapsulated heat sinks 132 and/or thermally conductive heat spreading elements 238 is/are located proximate active surface 106 as compared to the density and/or number of encapsulated heat sinks 132 and thermally conductive heat spreading elements 238 located proximate surface 131). Stated differently, the density of encapsulated heat sinks 132 and/or the density of thermally conductive heat spreading elements 238 may be inversely related to the distance from semiconductor die 102. The density and/or number of encapsulated heat sinks 132 and/or thermally conductive heat spreading elements 238 proximate shield 133 may be less than the density and/or number of encapsulated heat sinks 132 and/or thermally conductive heat spreading elements 238 proximate semiconductor die 102.

Figure 4:
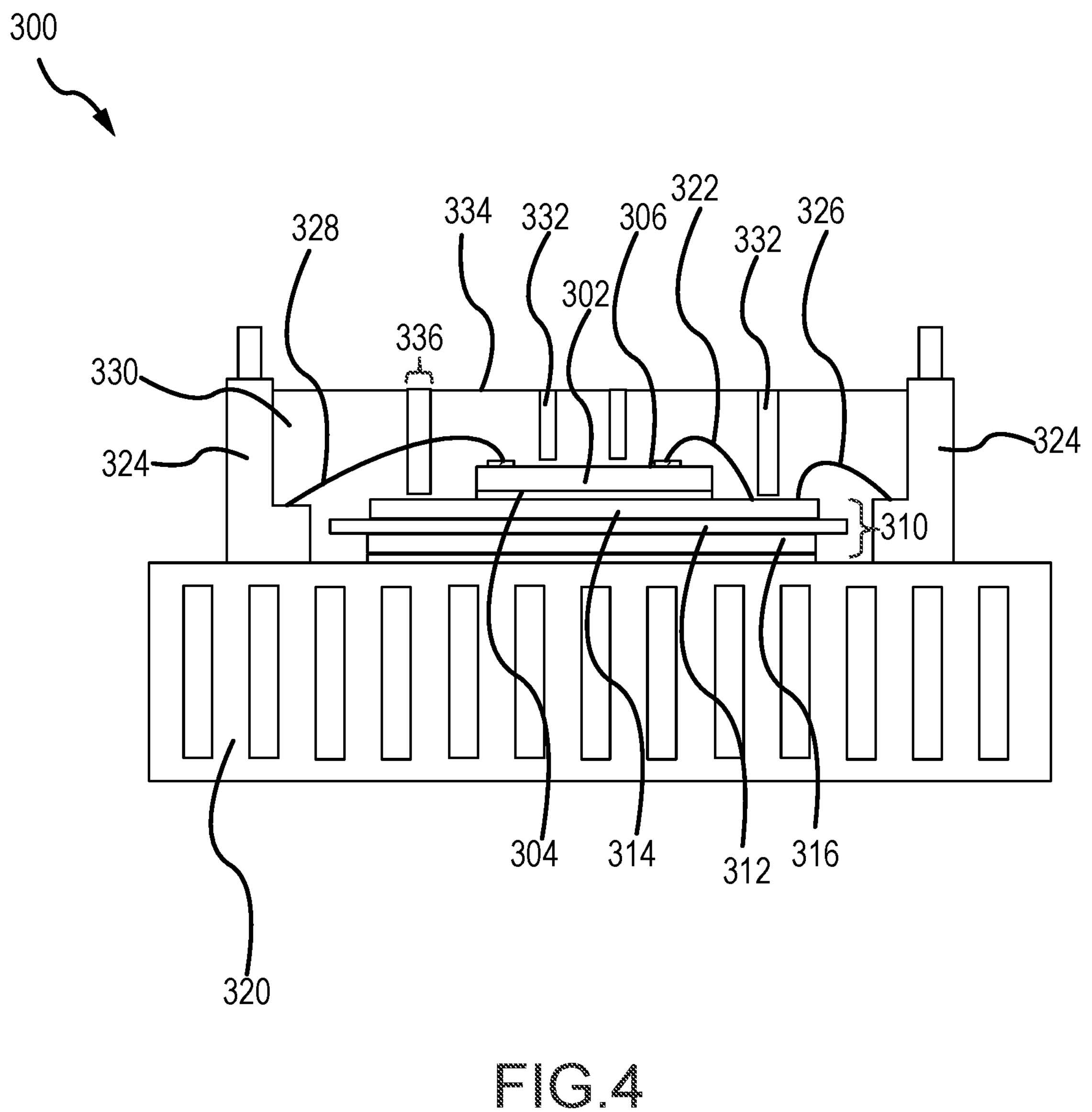
FIG. 4 illustrates an exemplary power electronic package including heat pipes, in accordance with various embodiments.
Figure 5:
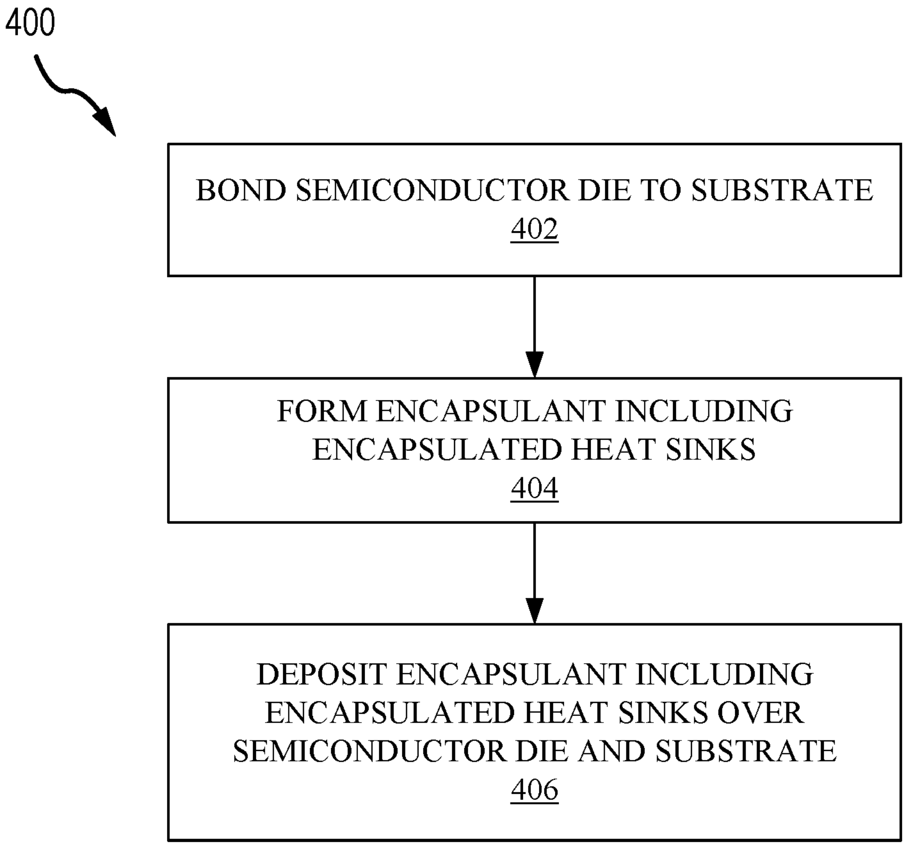
FIG. 5 illustrates a method for manufacturing a power electronics package, in accordance with various embodiments.

With reference to FIG. 4, a PE package 300 is illustrated, in accordance with various embodiments. In various embodiments, PE package 300 may be mounted to PCB 52 in FIG. 1. PE package 300 includes a semiconductor die 302. Semiconductor die 302 has a back surface 304 and an active surface 306 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed on active surface 306 to implement analog circuits or digital circuits, such as DSP, ASIC, MEMS, memory, or other signal processing circuit. In one embodiment, active surface 106 contains a MOSFET and/or IGBT. Semiconductor die 302 may also contain IPDs, such as inductors, capacitors, and resistors, for RF signal processing.

Semiconductor die 302 is mounted on a substrate 310. For example, back surface may be attached to substrate 310 via solder, an adhesive, or any other suitable bonding material. In various embodiments, substrate 310 may be a DCB substrate. In this regard, substrate 310 may include a ceramic layer 312, a first conductive layer 314 formed over, or bonded to, a first side of the ceramic layer 312, and a second conductive layer 316 formed over or bonded to a second side of the ceramic layer 312. First and second conductive layers 314, 316 may include one or more layers of Al, Cu, Sn, Ni, Au, Ag, or other suitable electrically conductive material or combination thereof. In various embodiments, first conductive layer 314 may be bonded to ceramic layer 312 using a high-temperature oxidation process. First conductive layer 314 may be chemically etched or otherwise formed into one or more an electrical circuit(s) over ceramic layer 312. In various embodiments, the second conductive layer 316 extends continuously and/or uninterrupted over the second side of ceramic layer 312. Ceramic layer 312 may comprise, for example, alumina ($Al_2O_3$), aluminum nitride (AlN), beryllium oxide (BeO), or the like.

In various embodiments, substrate 310 may be attached to a heat sink 320. For example, second conductive layer 316 may be bonded to heat sink 320 via solder, an adhesive, or any other suitable bonding material. Heat sink 320 may comprise a metal (e.g., Al, Cu, Ni, Ag), metal alloy, or any other thermally conductive material.

Semiconductor die 302 is electrically connected to first conductive layer 314 via one or more wire(s) 322. Electrically conductive terminal lead 324 is electrically connected to first conductive layer 314 via one or more one wire(s) 326. In this regard, semiconductor die 302 may be electrically connected to terminal lead 324 via first conductive layer 314 of substrate 310. In various embodiments, one or more lead wire(s) 328 may extend between and be electrically connected to semiconductor die 302 and terminal lead 324.

In accordance with various embodiments, an encapsulant, or molding compound, 330 is deposited over semiconductor die 302, substrate 310, and heat sink 320 as an insulating material using a paste printing, compressive molding, transfer molding, liquid encapsulant molding, vacuum lamination, spin coating, or other suitable application process. In particular, encapsulant 330 is disposed over and around semiconductor die 302 and substrate 310. Encapsulant 330 may extend to and/or contact heat sink 320. Encapsulant 330 may include polymer composite material, such as silicone gel, epoxy resin with filler, epoxy acrylate with filler, or polymer with proper filler. Encapsulant 330 is electrically non-conductive and environmentally protects the semiconductor device from external elements and contaminants.

In accordance with various embodiments, one or more heat pipes 332 may be located in encapsulant 330. Heat pipes 332 may be configured to direct heat away from active surface 306 and/or toward a surface 334 of encapsulant 330. Surface 334 of encapsulant 330 may be generally opposite, or distal to, back surface 304 and heat sink 320. Heat pipes 332 may be located over active surface 306 and/or first conductive layer 314. Heat pipes 332 may be spaced apart from active surface 306, such that a portion of encapsulant 330 is located between active surface 306 and an end of heat pipes 332. Heat pipes 332 may be spaced apart from first conductive layer 314, such that a portion of encapsulant 330 is located between first conductive layer 314 and the end of heat pipes 332. Heat pipe 332 have a diameter (or width) 336. Diameter 336 may be between and 0.5 millimeters (mm) and 5.0 mm, between 0.75 mm and 2 mm, and/or of about 1.0 mm. As used in the previous context only, the term "about" means±0.25 mm.

In accordance with various embodiments, heat pipes 332 include a working fluid configured to change phases (e.g., evaporate). An energy adsorption associated with the working fluid changing from a liquid to a gas may about 10° C. or greater than a nominal allowable die temperature. For example, the working fluid may have a boiling point between 70° C. and 120° C. between 80° C. and 110° and/or between 90° C. and 100° C. The working fluid may include, for example, water, ammonia, methanol, acetone, or other fluid having a phase transition temperature (e.g., boiling point) in the range of interest (e.g., between 90-120° C.).

It is to be understood that other working fluids may be used if the fluid has the requisite thermal storage capacity. The working fluid should have reversible phase transitions with sufficiently large latent heats at the temperatures associated with peak energy loads (e.g., temperatures between 90° C. and 120° C.).

In various embodiments, a greater number and/or greater density of heat pipes 332 may be located in encapsulant 330 proximate semiconductor die 302. In this regard, the density and/or number of heat pipes 332 may decrease between semiconductor die and terminal lead 324 (i.e., a greater density and/or number of heat pipes 332 is/are located proximate active surface 306 as compared to the density and/or number of heat pipes 332 located proximate terminal lead 324). Stated differently, the density of heat pipes 332 may be inversely related to the distance from semiconductor die 302.

Encapsulant 330 including heat pipes 332 tends to provide significant overheat protection according to various embodiments. The heat pipes 332 may allow for the size and/or weight of heat sink 320 to be reduced. In various embodiments, encapsulated heat sinks, similar to encapsulated heat sinks 132 in FIGS. 2A and 2B or to encapsulated heat sinks 232 in FIGS. 3A and 3B, may be impregnated into, or otherwise dispersed in, encapsulant 330. In various embodiments, thermally conductive heat spreading elements, similar to thermally conductive heat spreading elements 230 in FIG. 3A, may also be impregnated into, or otherwise dispersed in, encapsulant 330.

With reference to FIG. 4, a method 400 of manufacturing a power electronics package is also disclosed herein. In accordance with various embodiments, method 400 may comprise bonding a semiconductor die to a substrate (step 402), forming an encapsulant including a plurality of encapsulated heat sinks dispersed in the encapsulant (step 404), and depositing the encapsulant including the plurality of encapsulated heat sinks over the semiconductor die and the substrate (step 406).

In various embodiments, method 400 may further include locating a plurality of heat pipes over an active surface of the semiconductor die. In various embodiments, step 406 may be performed after locating the plurality of heat pipes over the active surface of the semiconductor die. In various embodiments, the heat pipes may be located over the active surface of the semiconductor die after depositing the encapsulant, but prior to curing the encapsulant.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods, and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A power electronic package, comprising:

a substrate;

a semiconductor die bonded to a first surface of the substrate;

an encapsulant deposited over the semiconductor die and the substrate;

a shield disposed over a surface of the encapsulant and configured to protect/shield the semiconductor die from interference; and a plurality of encapsulated heat sinks dispersed in the encapsulant, wherein a density of encapsulated heat sinks proximate the shield is less than a density of encapsulated heat sinks proximate the semiconductor die.

2. The power electronic package of claim 1, further comprising a heat sink bonded to a surface of the substrate opposite the semiconductor die.

3. The power electronic package of claim 2, wherein the shield extends from the heat sink.

4. The power electronic package of claim 2, wherein each encapsulated heat sink of the plurality of encapsulated heat sinks includes a heat sink material and an encapsulation layer surrounding the heat sink material.

5. The power electronic package of claim 4, wherein the heat sink material has a melting point between 80° C. and 120° C.

6. The power electronic package of claim 5, wherein each encapsulated heat sink of the plurality of encapsulated heat sinks further includes a plurality of thermally conductive heat spreading elements located within the encapsulation layer.

7. The power electronic package of claim 6, wherein thermally conductive heat spreading elements include may be nano-sized particles.

8. The power electronic package of claim 6, wherein the thermally conductive heat spreading elements include at least one of nano-sized graphene particles, carbon nanotubes, or boron nitride nanosheets.

9. The power electronic package of claim 5, further including a plurality of heat pipes located in the encapsulant.

10. The power electronic package of claim 5, wherein a density of thermally conductive heat spreading elements proximate the shield is less than a density of thermally conductive heat spreading elements proximate the semiconductor die.

11. The power electronic package of claim 1, wherein:

the semiconductor die is bonded to the first surface of the substrate via a bonding material; and the encapsulant comprises a non-conductive material.

12. A power electronic package, comprising:

a substrate;

a semiconductor die bonded to a first surface of the substrate;

an encapsulant deposited over the semiconductor die and the substrate;

a shield disposed over a surface of the encapsulant and configured to protect/shield the semiconductor die from interference; and a plurality of heat pipes located in the encapsulant, wherein a density of heat pipes proximate the shield is less than a density of heat pipes proximate the semiconductor die.

13. The power electronic package of claim 12, wherein each heat pipe of the plurality of heat pipes includes a working fluid having a boiling point between 80° C. and 120° C.

14. The power electronic package of claim 13, wherein at least one heat pipe of the plurality of heat pipes is located over an active surface of the semiconductor die.

15. The power electronic package of claim 14, the at least one heat pipe is configured to direct heat away from the active surface of the semiconductor die.

16. The power electronic package of claim 13, further comprising a heat sink located over a surface of the substrate opposite the semiconductor die.

17. The power electronic package of claim 16, wherein the plurality of heat pipes is configured to direct heat away toward a surface of the encapsulant, the surface of the encapsulant being distal to the heat sink.

18. The power electronic package of claim 13, further comprising a plurality of encapsulated heat sinks dispersed in the encapsulant.

19. The power electronic package of claim 18, wherein each encapsulated heat sink of the plurality of encapsulated heat sinks includes a heat sink material and an encapsulation layer surrounding the heat sink material.

20. The power electronic package of claim 19, wherein the heat sink material has a melting point between 80° C. and 120° C.

* * * * *